US010992293B2

(12) United States Patent
Li et al.

(10) Patent No.: US 10,992,293 B2
(45) Date of Patent: Apr. 27, 2021

(54) DEVICE WITH ISOLATION BARRIER AND FAULT DETECTION

(71) Applicant: TEXAS INSTRUMENTS INCORPORATED, Dallas, TX (US)

(72) Inventors: Xiong Li, Allen, TX (US); William Toth, Garland, TX (US); Honglin Guo, Dallas, TX (US); Danyang Zhu, Cary, NC (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 326 days.

(21) Appl. No.: 16/137,146

(22) Filed: Sep. 20, 2018

(65) Prior Publication Data

US 2020/0096574 A1 Mar. 26, 2020

(51) Int. Cl.
*H03K 17/08* (2006.01)
*H03K 17/081* (2006.01)

(52) U.S. Cl.
CPC ..... *H03K 17/08112* (2013.01); *H03K 17/081* (2013.01)

(58) Field of Classification Search
CPC ........... H03K 17/081; H03K 17/08112; H03K 17/08; H03K 17/08122
See application file for complete search history.

(56) References Cited

U.S. PATENT DOCUMENTS

| 10,215,795 | B1* | 2/2019 | Zannoth | H03K 17/18 |
| 10,763,844 | B2* | 9/2020 | Bang | H03K 17/08122 |
| 2015/0323588 | A1* | 11/2015 | Peng | G01R 31/2836 |
| | | | | 315/209 R |
| 2015/0326127 | A1* | 11/2015 | Peng | H02M 3/33507 |
| | | | | 315/209 R |
| 2015/0338866 | A1* | 11/2015 | Hu | H03M 5/08 |
| | | | | 323/280 |
| 2019/0356128 | A1* | 11/2019 | Shimizu | H02H 7/205 |
| 2019/0363706 | A1* | 11/2019 | Shinomiya | H03K 17/06 |

* cited by examiner

*Primary Examiner* — Rafael O De Leon Domenech
(74) *Attorney, Agent, or Firm* — Mark Allen Valetti; Charles A. Brill; Frank D. Cimino

(57) ABSTRACT

A device that comprises a first semiconductor die and a second semiconductor die. The first semiconductor die comprises a first clock signal generator. The second semiconductor die comprises a fault detection circuit, the fault detection circuit comprising a second clock signal generator, a first counter coupled to the second clock signal generator, multiple storage devices coupled to the second clock signal generator and to the first counter, a logic gate coupled to the multiple storage devices, a second counter coupled to the logic gate and to the first clock signal generator, and a comparator coupled to the logic gate and the second counter.

24 Claims, 4 Drawing Sheets

DEVICE WITH ISOLATION BARRIER AND FAULT DETECTION

BACKGROUND

High voltage devices may provide isolation barriers that separate a low voltage portion of the device from a high voltage portion of the device. The isolation barriers reduce the risk of electrical shock to human beings, and the risk of damage to other electronic or electrical equipment, in the event of a failure on the high voltage portion of the device. High voltage devices are used in electric motor applications, electric generator applications, electric converter applications, and high power amplifier applications.

SUMMARY

In accordance with at least one example of the disclosure, a device comprises a first semiconductor die and a second semiconductor die. The first semiconductor die comprises a first clock signal generator. The second semiconductor die comprises a fault detection circuit, the fault detection circuit comprising a second clock signal generator, a first counter coupled to the second clock signal generator, multiple storage devices coupled to the second clock signal generator and to the first counter, a logic gate coupled to the multiple storage devices, a second counter coupled to the logic gate and to the first clock signal generator, and a comparator coupled to the logic gate and the second counter.

In accordance with at least one example of the disclosure, a device comprises a first semiconductor die and a second semiconductor die. The first semiconductor die comprises a first clock signal generator. The second semiconductor die comprises a fault detection circuit, the fault detection circuit comprising a second clock signal generator, a first counter coupled to the second clock signal generator, multiple storage devices coupled to the second clock signal generator and to the first counter, a logic gate coupled to the multiple storage devices, a second counter coupled to the logic gate and to the first clock signal generator, an amplifier coupled to the second counter, an analog-to-digital converter (ADC) coupled to the amplifier, and another storage device coupled to the ADC.

In accordance with at least one example of the disclosure, a system comprises a power transistor, an isolated gate driver, and a controller coupled to the isolated gate driver. The isolated gate driver comprises a high voltage portion that is isolated from a low voltage portion of the isolated gate driver, is configured to control operation of the power transistor in response to a control signal received from the low voltage portion, and is configured to provide a clock signal to a fault detection circuit of the low voltage portion, wherein the fault detection circuit is configured to generate a fault signal in response to failing to detect the clock signal. The controller is configured to output the control signal to the low voltage portion of the isolated gate driver, to receive the fault signal from the low voltage portion of the isolated gate driver, and to interrupt delivery of power to the power transistor in response to receipt of the fault signal from the fault detection circuit.

In accordance with at least one example of the disclosure, a method comprises receiving a control signal by a low voltage portion of an isolated gate driver, the low voltage portion on a first semiconductor die, transmitting the control signal by the low voltage portion to a high voltage portion of the isolated gate driver, the high voltage portion on a second semiconductor die, and driving a power transistor by the high voltage portion based on the control signal. The method further comprises generating a clock signal by the high voltage portion, transmitting the clock signal by the high voltage portion to the low voltage portion, monitoring the clock signal received from the high voltage portion by a fault detection circuit of the low voltage portion, and based on the monitoring of the clock signal, outputting a fault signal to a controller, wherein the controller is configured to control power supply to the power transistor.

BRIEF DESCRIPTION OF THE DRAWINGS

For a detailed description of various examples, reference will now be made to the accompanying drawings in which.

DETAILED DESCRIPTION

High voltage devices are manufactured with a high voltage portion and a low voltage portion separated by a physical isolation barrier. When a fault condition arises on the high voltage portion, an electrical overstress (EOS) event may occur, which may damage the high voltage device. This damage in the high voltage device may cause further damage to other electronic and/or electric equipment in a system. The risk of system damage may be high when the failure of the high voltage device is not timely detected and remediated.

The present disclosure teaches a high voltage device having an isolation barrier and a fault detection circuit. A high voltage portion of the device comprises a clock generator that sends a clock signal to a low voltage portion of the high voltage device. The low voltage portion of the device comprises a fault detection circuit that monitors the clock signal received from the high voltage portion and generates a fault signal in the event the clock signal is no longer received.

In an example, the high voltage device is a gate driver that controls a power transistor, which in turn controls power delivery to an electric motor, an electric converter, or other high voltage electric load. A power transistor can be any transistor suitable for use in high voltage applications. High voltage may refer to a voltage range of 200 volts DC to 2,000 volts DC, and low voltage may refer to a voltage range that is less than the high voltage range—for example, less than 40 volts DC. Electric power may be sourced to the power transistor through a solid state relay (SSR) that is controlled by a microcontroller unit (MCU). The high voltage device receives a control signal from the MCU at a low voltage level. The low voltage portion of the device processes the control signal in an application-specific manner and sends the processed control signal to the high voltage portion of the device. The high voltage portion of the device controls the power transistor based on the processed control signal received from the low voltage portion of the device. When the fault detection circuit of the low voltage portion of the device no longer receives the clock signal from the high voltage portion of the device (e.g., because the high voltage portion of the device has been rendered inoperative by an overvoltage condition), the fault detection circuit sends a fault signal to the MCU, and the MCU commands the SSR to open, thereby interrupting delivery of electric power to the power transistor. In some contexts, no longer receiving the clock signal from the high voltage portion of the device is referred to as failing to detect the clock signal. Because this sequence of fault detection, fault signaling, and relay command occurs quickly (e.g., in less than 0.5 microseconds), risk of harm to human beings and risk of damage to other equipment can be reduced.

Figure 1:
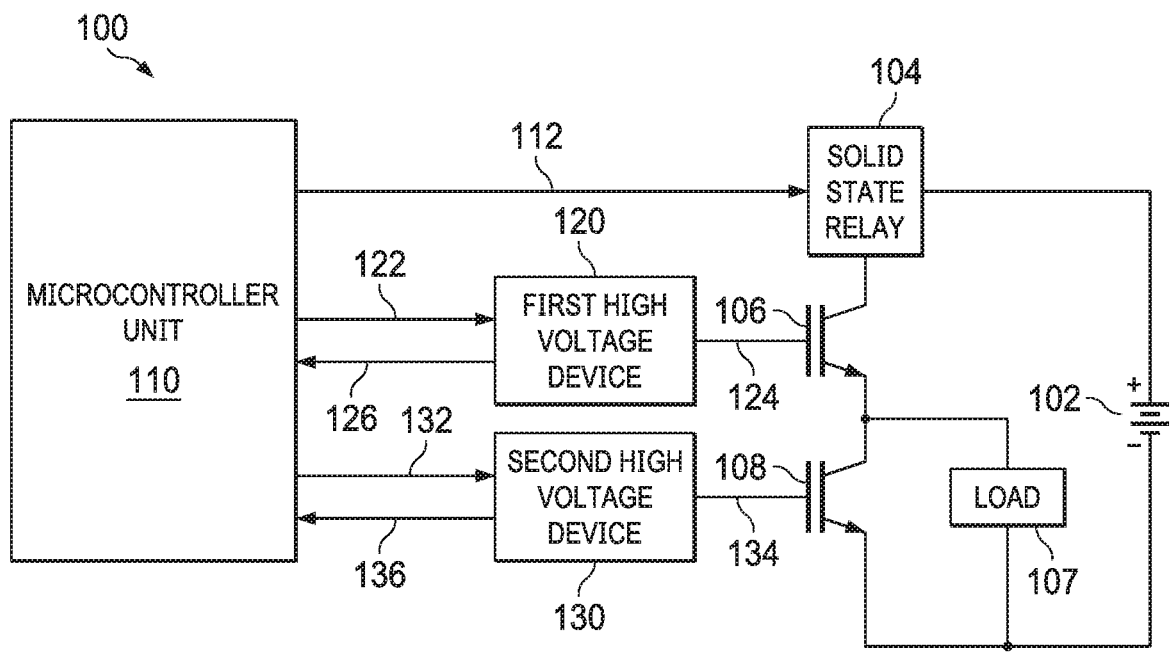
FIG. 1 shows a system in accordance with an aspect of the present disclosure.

FIG. 1 depicts a system 100. In an example, the system 100 comprises an electric power source 102, a solid state relay (SSR) 104, a first power transistor 106, an electric load 107, and a second power transistor 108. In an example, the power transistors 106, 108 are insulated-gate bipolar transistors (IGBTs). In an example, the power transistors 106, 108 are power field effect transistors (FETs) or bipolar junction transistors (BJTs). In an example, the electric load 107 is an electric motor or an electric converter. The system 100 comprises a microcontroller unit (MCU) 110, a first high voltage device 120, and a second high voltage device 130. In some contexts, the high voltage devices 120, 130 are referred to as first and second devices, respectively, or as isolated gate drivers. In an example, isolated gate drivers amplify control signals received from a controller device (e.g., the MCU 110) and provide high voltage isolation from a high voltage circuit to which they relay the amplified control signals. The MCU 110 is coupled to the SSR 104 by a control line 112. The MCU 110 is coupled to the first device 120 by a first control input line 122 and by a first fault signal line 126. The MCU 110 is coupled to the second device 130 by a second control input line 132 and by a second fault signal line 136. The first device 120 is coupled to the first power transistor 106 by a first transistor control line 124, and the second device 130 is coupled to the second power transistor 108 by a second transistor control line 134. In some contexts, the power transistors 106, 108 are referred to as high voltage transistors. In some contexts, power transistors and high voltage transistors are referred to as high voltage components.

While illustrated as a battery in FIG. 1, the electric power source 102 may be any source of electric power, either DC or AC. In an example, the electric power source 102 may be AC power mains. In an example, the electric power source 102 may be a DC electric generator or an AC electric generator. Because the electrical voltage provided by the electric power source 102 is high voltage (e.g., in the range 200 VDC to 2000 VDC), the power transistors 106, 108, the electric power source 102, and the SSR 104 together constitute a high voltage application. In an example, the high voltage devices 120, 130 are said to be high voltage devices because they are used to control, at least in part, a high voltage application.

During normal operation of the system 100, the MCU 110 commands the SSR 104 to deliver high voltage electric power from the electric power source 102 through the power transistors 106, 108 to the electric load 107. For example, the MCU 110 commands the SSR 104 to close, thereby delivering electric power from the electric power source 102 to the power transistors 106, 108. The MCU 110 controls the flow of electric power through the power transistors 106 by sending a first control signal associated with the first power transistor 106 on the first control input line 122 to the first high voltage device 120. The first high voltage device 120 processes the first control signal in an application-specific manner and provides a processed first control signal to the first power transistor 106 via the first transistor control line 124. The MCU 110 controls the flow of electric power through the power transistor 108 by sending a second control signal associated with the second power transistor 108 on the second control input line 132 to the second high voltage device 130. The second high voltage device 130 processes the second control signal in an application-specific manner and provides a processed second control signal to the second power transistor 108 via the second transistor control line 134.

When a fault condition occurs on one of the high voltage devices 120, 130, a fault signal is sent to the MCU 110 on the associated fault signal line 126, 136. Upon receiving the fault signal, the MCU 110 commands the SSR 104 to open. When the SSR 104 opens, power delivery from the power source 102 is interrupted, thereby preventing further damage. In some contexts, when the SSR 104 is closed, it is said to be in a closed mode and when the SSR 104 is open, it is said to be in an open mode.

Figure 2:
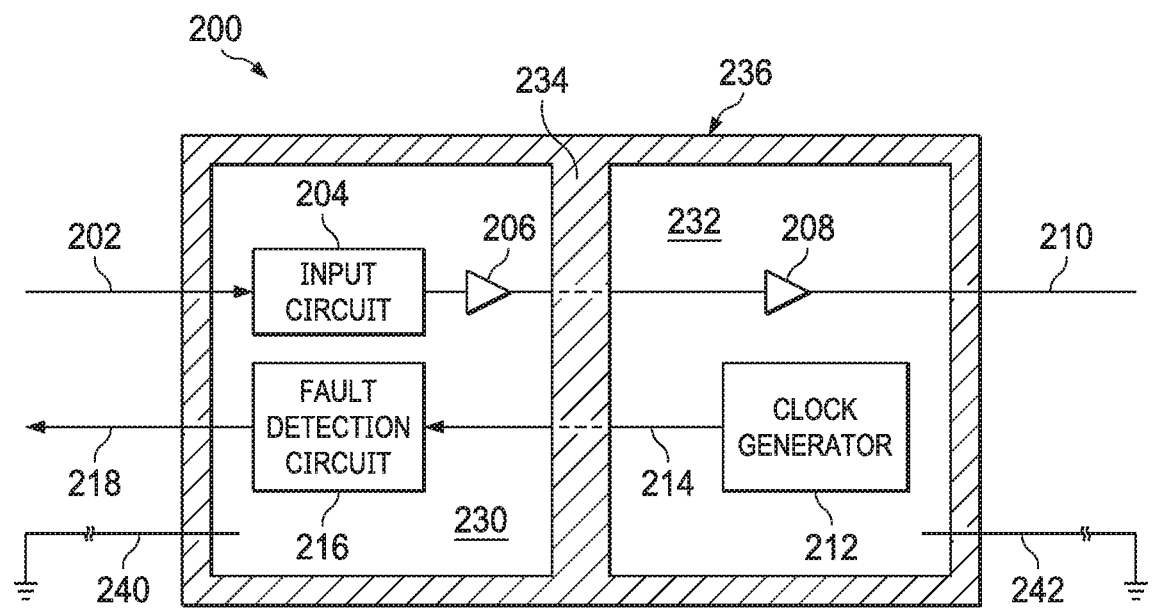
FIG. 2 shows a device with an isolation barrier and a fault detection circuit in accordance with an aspect of the present disclosure.

FIG. 2 depicts a high voltage device 200, which is representative of examples of the high voltage devices 120, 130. The device 200 comprises a control input line 202, input circuit 204, a first amplifier 206, a second amplifier 208, a control output line 210, a clock generator 212, a clock signal line 214, a fault detection circuit 216, and a fault signal output line 218. In some contexts, the control input line 202 is referred to as an external control pin of the device 200, and the fault signal output line 218 is referred to as a fault output pin of the device 200. The device 200 comprises a low voltage portion 230 and a high voltage portion 232 separated by an isolation barrier 234. In an example, the low voltage portion 230 is fabricated on a first semiconductor die and the high voltage portion 232 is fabricated on a second semiconductor die. The input circuit 204, the first amplifier 206, and the fault detection circuit 216 are fabricated as part of the first semiconductor die of the low voltage portion 230. The second amplifier 208 and the clock generator 212 are fabricated as part of the second semiconductor die of the high voltage portion 232. The low voltage portion 230 and the high voltage portion 232 may be adhered to, soldered to, or cemented to a lead frame (e.g., separate die pads) in the package structure 236, or to electrically isolated lead frames in the package structure 236. In some contexts the second amplifier 208 is referred to as a high voltage electronic driver.

The high voltage portion 232 is referred to as a high voltage portion because it is configured to be coupled to a high voltage application. The low voltage portion 230 is referred to as a low voltage portion because it is not configured to be coupled to a high voltage application. In an example, the low voltage portion 230 is configured to be coupled to voltage levels of less than 40 VDC. In an example, the low voltage portion 230 is configured to be coupled to voltage levels of 36 VDC or less. In an example, the low voltage portion 230 is configured to be coupled to a first electrical ground 240, and the high voltage portion 232 is configured to be coupled to a second electrical ground 242 that is isolated from the first electrical ground 240. In an example, the input circuit 204 receives a control signal on the input line 202, processes the control signal in an application-specific manner, and passes the processed control signal to the first amplifier 206. The input circuit 204 filters, modulates, and/or performs logic operations on the control signal. The first amplifier 206 sends the processed control signal to the second amplifier 208. The second amplifier 208, in turn, drives a power transistor (e.g., the transistors 106, 108 of FIG. 1) via control output line 210.

In an example, external electrical connections from the low voltage portion 230 to pins coupled to the package structure 236 are provided using a low voltage portion lead frame and external electrical connections from the high voltage portion 232 to pins coupled to the package structure 236 are provided using a high voltage portion lead frame. In an example, the isolation barrier 234 is provided by a physical separation between the low voltage portion 230 and the high voltage portion 232. In an example, the isolation barrier 234 is about 500 uM (micrometers) wide. In an example, the isolation barrier 234 is from 450 uM to 550 uM wide. In an example, the isolation barrier 234 is from 350 uM to 455 uM wide. In an example, the isolation barrier 234 is from 540 uM wide to 800 uM wide. In an example, the isolation barrier 234 is from 300 uM to 1000 uM wide. In an example, connection wires from the first amplifier 206 to the second amplifier 208 and the clock signal line 214 to the fault detection circuit 216 are provided as bond wires that cross over the isolation barrier 234. The bond wires are constructed so they are readily fused and thereby destroyed in response to high voltage and/or high current.

While the high voltage portion 232 remains functional, the clock generator 212 continuously generates and transmits a clock signal via the clock signal line 214 to the fault detection circuit 216. During an EOS event in the high voltage portion 232, the clock generator 212 may be destroyed, the clock signal line 214 may be destroyed, or both. This destruction occurs because the EOS event overheats the high voltage portion 232, causing the clock signal line 214 to fuse and/or causing the clock generator 212 to fail from heat damage. In an example, this destruction occurs because the EOS event causes a physical rupture of the packaging over the high voltage portion 232. Such an EOS event can cause the fault detection circuit 216 to stop receiving the clock signal form the clock generator 212. In response, the fault detection circuit 216 generates a fault signal on the fault signal output line 218. A controller, such as the MCU 110 (FIG. 1), receives the fault signal and, in response, it causes the SSR 104 (FIG. 1) to interrupt power supply to the power transistor(s) 106, 108.

Figure 3A:
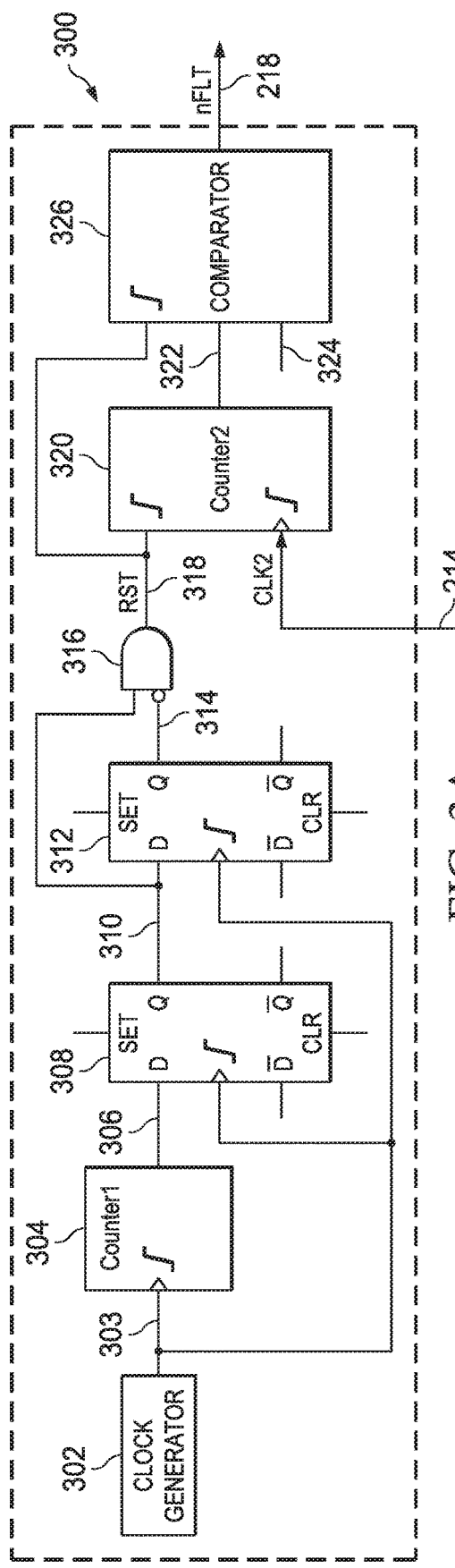
FIG. 3A shows a fault detection circuit in accordance with an aspect of the present disclosure.

FIG. 3A depicts an example fault detection circuit 300. In an example, the fault detection circuit 216, described with reference to FIG. 2 above, is implemented by the fault detection circuit 300. In an example, the fault detection circuit 300 comprises an internal clock generator 302, a first counter 304, a first D flip-flop 308, a second D flip-flop 312, an AND logic gate 316, a second counter 320, and a comparator 326. In some context, the D flip-flops 308, 312 may be referred to as a first storage device and a second storage device respectively. In an example, another type of storage device may be substituted for either of the D flip-flops 308, 312. The internal clock generator 302 is coupled to a clock input of the first counter 304 by a CLK 1 signal line 303. The first counter 304 is coupled to a D input of the first D flip-flop 308 by a counter 1 signal line 306. A clock input of the first D flip-flop 308 is coupled to the internal clock generator 302 by the CLK 1 signal line 303. The Q output of the first D flip-flop 308 is coupled by a line 310 to a D input of the second D flip-flop 312 and to an input of the AND logic gate 316. A clock input of the second D flip-flop 312 is coupled to the internal clock generator 302 by the CLK 1 signal line 303. The Q output of the second D flip-flop 312 is coupled to an inverting input of the AND logic gate 316 by line 314. An output of the AND logic gate 316 is coupled to a reset input of the second counter 320 by a reset signal line 318. A clock input of the second counter 320 is coupled to a CLK 2 signal line that is coupled to the clock signal line 214 that is coupled to the clock generator 212 of the high voltage portion of the high voltage device 200. An output of the second counter 320 is coupled via line 322 to an input of the comparator 326, which, in examples, is a digital comparator with a multi-bit input that couples to the line 322. The reset signal line 318 is coupled to a clock input of the comparator 326. A reference value is input on line 324 to the comparator 326. The comparator 326 outputs a fault signal (abbreviated nFLT) on fault signal output line 218. In an example, the reference value is provided as a digital value. In the event that the inputs to the comparator 326 are to be analog, a digital-to-analog converter (DAC) is positioned between the second counter 320 and the comparator 326. In an example, the DAC converts one or more bits output from the second counter 320 into an analog signal for provision to the comparator 326. In another example, the topology and components of the fault detection circuit 300 are different.

Figure 3B:
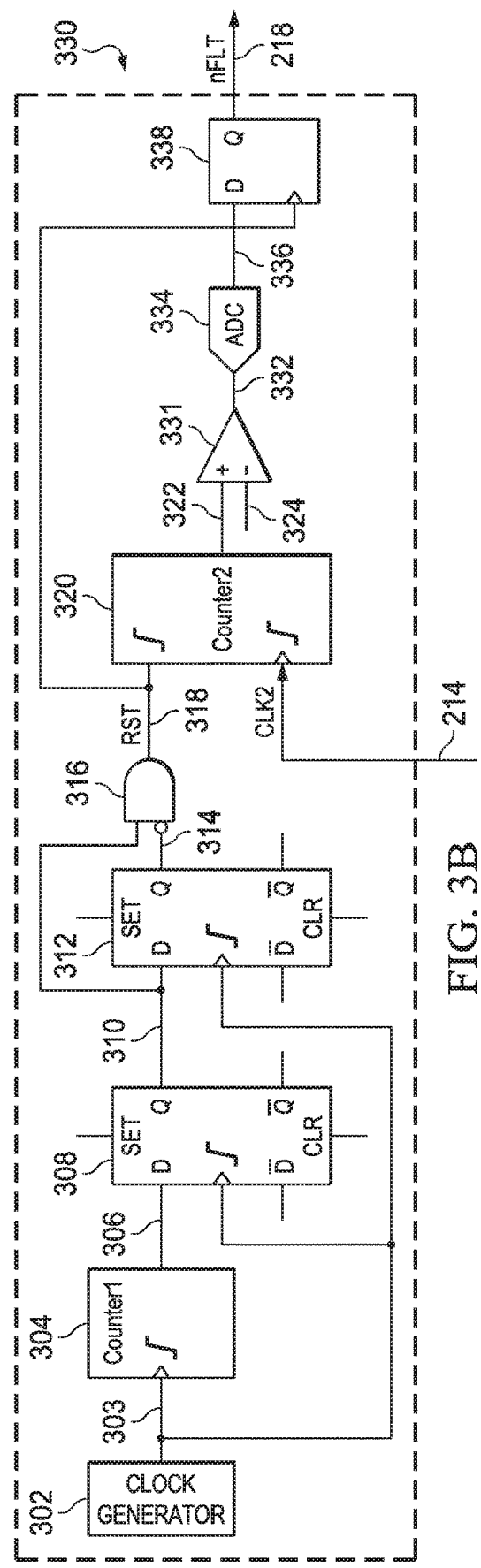
FIG. 3B shows another fault detection circuit in accordance with an aspect of the present disclosure.

FIG. 3B depicts a second example fault detection circuit 330. In an example, the fault detection circuit 216, described with reference to FIG. 2 above, is implemented by the second fault detection circuit 330. The second fault detection circuit 330 is substantially similar to the fault detection circuit 300 described above with reference to FIG. 3A, but with the comparator 326 replaced with an amplifier 331, an analog to digital converter (ADC) 334, and a third D flip-flop 338 together providing substantially similar function to the comparator 326. In an example, the line 322 couples the output of the second counter 320 to a non-inverting input of the amplifier 331, and the reference value input on line 324 is coupled to an inverting input of the amplifier 331. In an example, the line 322 is coupled to a most significant bit (MSB) of the second counter 320. In the example of FIG. 3B, the reference value input on line 324 is provided by a reference voltage source in the fault detection circuit 330 or in the low voltage portion 230. In an example, the reference value is provided by an external reference voltage source, for example, from a reference voltage source to an input pin of the device 200. In an example, a DAC (not shown) receives the output of the second counter 320, converts the digital value of that output to an analog value, and outputs that analog value via line 322 to the non-inverting input of the amplifier 331.

An output of the amplifier 331 is coupled to an input of the ADC 334 by a line 332. An output of the ADC 334 is coupled to a D input of the third D flip-flop 338 by a line 336. The reset signal line 318 is coupled to a clock input of the third D flip-flop 338.

Figure 4:
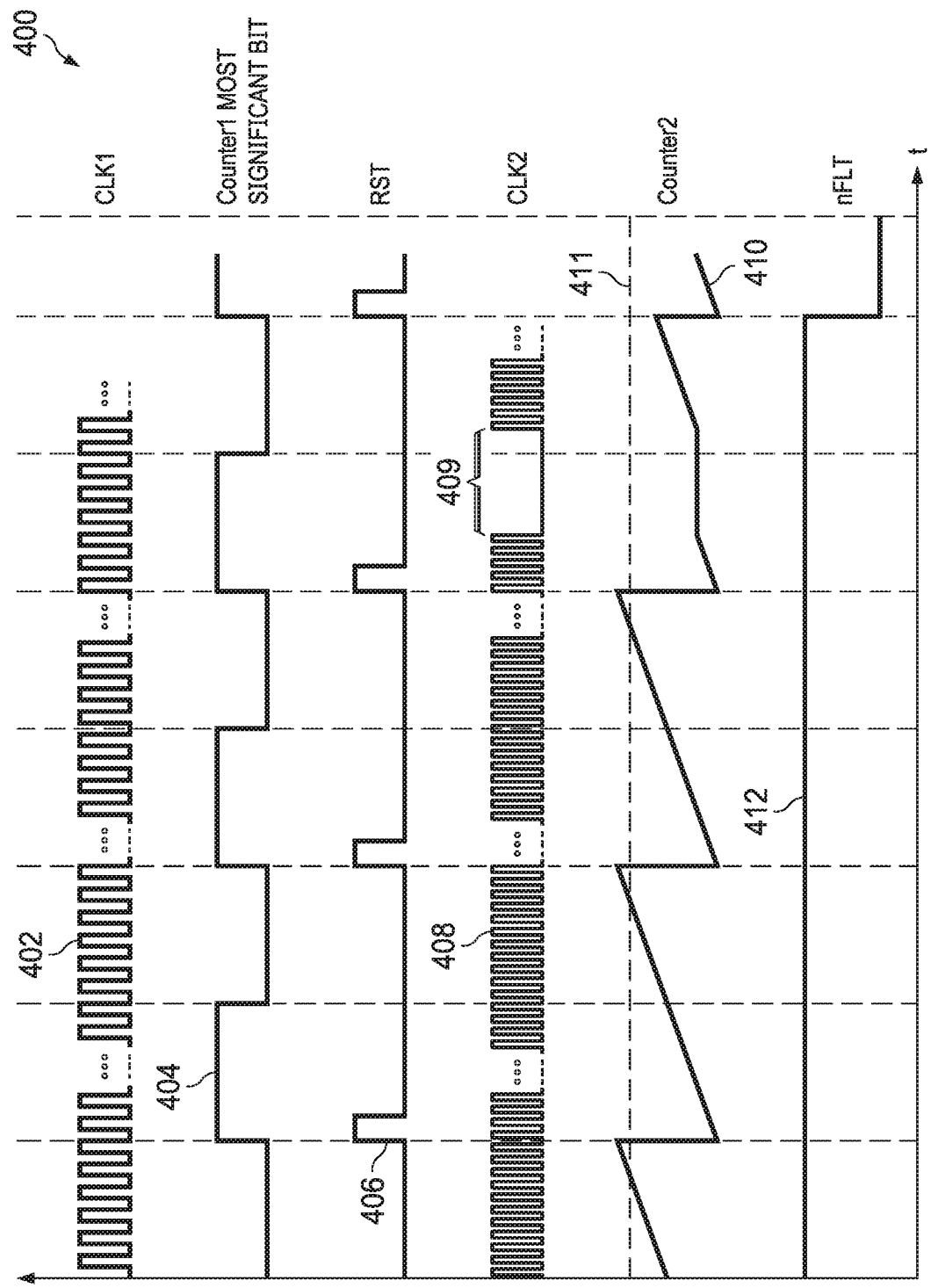
FIG. 4 shows fault detection waveforms in accordance with an aspect of the present disclosure.

FIG. 4 depicts a fault detection waveform diagram 400. The diagram 400 depicts waveforms of a CLK 1 signal 402, a counter 1 output signal 404, a reset signal 406, a CLK 2 signal 408, a counter 2 output signal 410, and a nFLT signal 412. The CLK 1 signal 402 represents the output of the internal clock generator 302. The counter 1 output signal 404 represents the output of the first counter 304. The reset signal 406 represents the output of the AND logic gate 316. The CLK 2 signal 408 represents the output of the clock generator 212 of the high voltage portion 232 of the high voltage device 200. For a duration of time 409 the CLK 2 signal 408 is lost (e.g., the clock generator 212 stops outputting the clock signal temporarily or the clock signal line 214 is temporarily interrupted). The counter 2 output signal 410 represents the output of the second counter 320, which appears as a sawtooth pattern because the output of the second counter 320 is a non-binary counter value that is repeatedly incremented and reset. The nFLT signal 412 represents the output of the comparator 326 of the fault detection circuit 300. Alternatively, the nFLT signal 412 represents the output of the third D flip-flop 338 of the second fault detection circuit 330. In an example, while no fault is detected, the fault signal on fault signal output line 218 is logic high, and while a fault is detected, the fault signal on fault signal output line 218 is logic low.

With reference again to FIG. 3A and FIG. 3B, the function of the fault detection circuit 300 and the second fault detection circuit 330 is now described with reference to the waveforms 400 of FIG. 4. The internal clock generator 302 generates the clock signal illustrated by CLK 1 signal 402. This clock signal is input to the clock input of the first counter 304, causing it to count up. The most significant bit (MSB) of an output of the first counter 304 is connected to the counter 1 signal line 306. For half the values of the first counter 304, this MSB is logic low; and for half the values of the first counter 304, this MSB is logic high, providing the square wave shape observed in counter 1 output signal 404.

The value on the counter 1 signal line 306 is input to the D input of the first D flip-flop 308 and the Q output of the first D flip-flop 308 is fed into the D input of the second D flip-flop 312. The first and second D flip-flops 308, 312 are clocked from the same source (namely CLK 1 signal line 303) and hence have the same value all the time, except for one period of the clock signal generated by the internal clock generator 302 (e.g., CLK 1 signal 402) when the MSB of the first counter 304 transitions high or transitions low. When the MSB transitions high, for one period of the CLK 1 signal 402, the Q output of the first D flip-flop 308 is logic high and the Q output of the second D flip-flop 312 is logic low. This combination of values drives the AND logic gate 316 to provide a logic high output on the reset signal line 318. The next cycle of the CLK 1 signal 402 causes the logic high output of the Q output of the first D flip-flop 308 to propagate through the second D flip-flop 312, and the AND logic gate 316 provides a logic low output on the reset signal line 318, thereby producing a narrow pulse reset signal as seen in FIG. 4 reset signal 406.

The reset signal pulse input to the reset of the second counter 320 causes the counter 320 to reset its count to 0. The output of the second counter 320 counts up in response to the CLK 2 signal 408 generated by the clock generator 212 of the high voltage portion of the high voltage device 200. The second counter 320 outputs this incrementing count to the comparator 326, and on the event of the rising edge of the reset signal (reset signal 406), the comparator 326 compares the value of the second counter 320 to the reference value input on line 324.

The reference value input on line 324 is chosen so that the output of the second counter 320 is greater than the reference value input on line 324 if it receives a predefined percentage of the clock pulses from the clock generator 212 during the on-going count cycle. If the count of the second counter 320 is greater than the reference value input on line 324 when the pulse edge of the reset signal 406 occurs, the output of the comparator 326 is set (remains) to logic high. The reference value input on line 324 is represented in FIG. 4 by dotted line 411. If the count of the second counter 320 is less than the reference value input on line 324 when the pulse edge of the reset signal 406 occurs, the output of the comparator 326 is reset to logic low. In this way, if the clock generator 212 (e.g., CLK 2 signal 408) stops completely or misses a predefined percentage of cycles, the fault detection circuit 300 signals a fault to the MCU 110 via fault signal 218.

By adjusting the frequency of the internal clock generator 302 and/or the configuration of the first counter 304 (e.g., selecting a counter with more bits or fewer bits), the period of the reset signal 406 can be tuned to shorten or extend the frequency of performing the comparison by the comparator 326, and this can adjust the time delays that are experienced in detecting a fault in the high voltage device 200. Additionally, by adjusting the predefined reference value input on line 324, the number of drop-outs of clock pulses in a single cycle that can be tolerated before generating the fault signal can be adjusted. In some contexts, this is referred to as adjusting a predefined time duration. Said in other words, the fault detection circuit 300, 330 outputs the fault signal based on a determination that the clock signal has stopped for at least a predefined time duration, where the predefined time duration is fixed by the ratio of the reference signal value to the second counter value 320 at the time the reset signal is pulsed when no fault is active.

When the second fault detection circuit 330 is used in the high voltage device 200, the output of the second counter 320 is provided to the amplifier 331 on line 322. The reference value input on line 324 is provided to the amplifier 331 on its inverting input, and the output of the amplifier 331 is provided to the ADC 334 on line 332. The ADC 334 outputs a digital value on line 336.

In an example, the MSB of the second counter 320 (or another output bit of the second counter 320) is a logic value where logic high is greater than the voltage reference 324 (in which case the operational amplifier 331 outputs a high value) and where logic low is less than the voltage reference 324 (in which case the operational amplifier 331 outputs a low value). Alternatively, a DAC is positioned between the second counter 320 and the positive input of the operational amplifier 331 and maps a multi-bit output of the second counter 320 into a corresponding analog value. In the second fault detection circuit 330, when the reset pulse occurs, the value present on the D-input of the third D flip-flop 338 is latched in and its value propagated to the output that feeds the fault signal output line 218.

Figure 5:
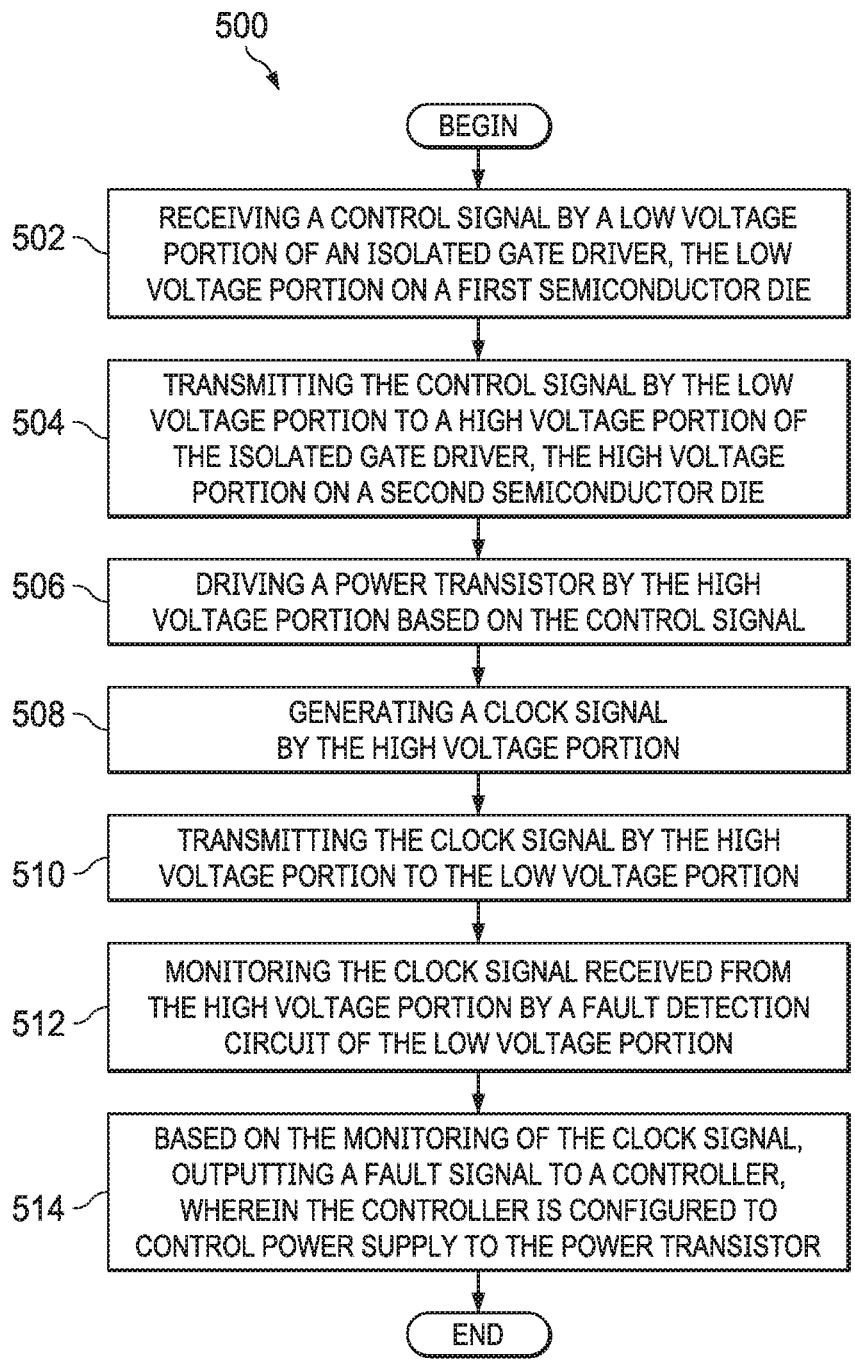
FIG. 5 shows a flow chart of a method for operating a high voltage device in accordance with an aspect of the present disclosure.

FIG. 5 depicts a flow chart of a method 500. The method 500 is a method of controlling a high voltage device (e.g., transistors 106, 108) and is performed by an isolated gate driver, such as high voltage device 200 described above with reference to FIG. 2 and FIG. 3. At block 502, the method 500 comprises receiving a control signal by a low voltage portion of an isolated gate driver, the low voltage portion on a first semiconductor die. At block 504, the method 500 comprises transmitting the control signal by the low voltage portion to a high voltage portion of the isolated gate driver, the high voltage portion on a second semiconductor die. At block 506, the method 500 comprises driving a power transistor by the high voltage portion based on the control signal. At block 508, the method 500 comprises generating a clock signal by the high voltage portion. At block 510, the method 500 comprises transmitting the clock signal by the high voltage portion to the low voltage portion. At block 512, the method 500 comprises monitoring the clock signal received from the high voltage portion by a fault detection circuit of the low voltage portion. At block 514, the method 500 comprises, based on the monitoring of the clock signal, outputting a fault signal to a controller, wherein the controller is configured to control power supply to the power transistor.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A device, comprising:
a first semiconductor die comprising a first clock signal generator; and
a second semiconductor die comprising a fault detection circuit, the fault detection circuit comprising:
a second clock signal generator;
a first counter coupled to the second clock signal generator;
multiple storage devices coupled to the second clock signal generator and to the first counter;
a logic gate coupled to the multiple storage devices;
a second counter coupled to the logic gate and to the first clock signal generator; and
a comparator coupled to the logic gate and the second counter.

2. The device of claim 1, wherein the first semiconductor die is a high voltage die and the second semiconductor die is a low voltage die.

3. The device of claim 1, wherein the fault detection circuit is configured to generate a fault signal in response to impaired function of the first clock signal generator.

4. The device of claim 1, wherein the fault detection circuit is configured to generate a fault signal in response to a failure to detect a clock signal generated by the first clock signal generator.

5. The device of claim 1, further comprising an isolation barrier positioned between the first and second semiconductor dies.

6. The device of claim 1, wherein an output of the second clock signal generator couples to a clock input of the first counter.

7. The device of claim 6, wherein the multiple storage devices include a first flip flop, wherein an output of the first counter couples to a D input of the first flip flop, and wherein the output of the second clock signal generator couples to a clock input of the first flip flop.

8. The device of claim 7, wherein the multiple storage devices include a second flip flop, wherein a Q output of the first flip flop couples to a D input of the second flip flop, and wherein the output of the second clock signal generator couples to a clock input of the second flip flop.

9. The device of claim 8, wherein the logic gate is an AND gate having a non-inverting input coupled to the Q output of the first flip flop and an inverting input coupled to a Q output of the second flip flop.

10. The device of claim 9, wherein a first clock input of the second counter couples to an output of the AND gate, and wherein a second clock input of the second counter couples to an output of the first clock signal generator.

11. The device of claim 10, wherein the output of the AND gate and an output of the second counter couple to the comparator, wherein the second counter couples to the comparator, and wherein the comparator couples to a reference voltage supply.

12. A device, comprising:
a first semiconductor die comprising a first clock signal generator; and
a second semiconductor die comprising a fault detection circuit, the fault detection circuit comprising:
a second clock signal generator;
a first counter coupled to the second clock signal generator;
multiple storage devices coupled to the second clock signal generator and to the first counter;
a logic gate coupled to the multiple storage devices;
a second counter coupled to the logic gate and to the first clock signal generator;
an amplifier coupled to the second counter;
an analog-to-digital converter (ADC) coupled to the amplifier; and
another storage device coupled to the ADC.

13. A system, comprising:
a power transistor;
an isolated gate driver, a high voltage portion of the isolated gate driver is isolated from a low voltage portion of the isolated gate driver, is configured to control operation of the power transistor in response to a control signal received from the low voltage portion, and is configured to provide a clock signal to a fault detection circuit of the low voltage portion, wherein the fault detection circuit is configured to generate a fault signal in response to failing to detect the clock signal; and
a controller coupled to the isolated gate driver, the controller configured to output the control signal to the low voltage portion of the isolated gate driver, to receive the fault signal from the low voltage portion of the isolated gate driver, and to interrupt delivery of power to the power transistor in response to receipt of the fault signal from the fault detection circuit.

14. The system of claim 13, wherein the power transistor comprises an insulated-gate bipolar transistor (IGBT).

15. The system of claim 13, further comprising a solid state relay (SSR) positioned between a power source and a load and controlled by the controller, wherein the controller is configured to open the SSR to prevent damage to the load in response to receipt of the fault signal.

16. The system of claim 13, wherein the interruption of the delivery of power protects the system against electrical overstress (EOS) events.

17. The system of claim 13, further comprising a solid state relay (SSR) coupled to the power transistor, to the controller, and to a power source, wherein the SSR is configured to deliver power from the power source to the power transistor while operated in a first mode and to interrupt delivery of power from the power source to the power transistor while operated in a second mode, and wherein the controller is configured to interrupt delivery of power to the power transistor by configuring the SSR to be in the second mode.

18. The system of claim 13, wherein the low voltage portion is coupled to a first electrical ground source and the high voltage portion is coupled to a second electrical ground source that is isolated from the first electrical ground source.

19. The system of claim 18, wherein the high voltage portion is on a first semiconductor die, the low voltage portion is on a second semiconductor die, and an isolation barrier is positioned between the first and second semiconductor dies.

20. The system of claim 13, wherein the fault detection circuit comprises:
a counter configured to receive the clock signal; and
a comparator having a first input coupled to an output of the counter, a second input configured to receive a reference voltage, and an output configured to generate the fault signal in response to a failure to detect the clock signal.

21. A method, comprising:
receiving a control signal by a low voltage portion of an isolated gate driver, the low voltage portion on a first semiconductor die;
transmitting the control signal by the low voltage portion to a high voltage portion of the isolated gate driver, the high voltage portion on a second semiconductor die;
driving a power transistor by the high voltage portion based on the control signal;
generating a clock signal by the high voltage portion;
transmitting the clock signal by the high voltage portion to the low voltage portion;
monitoring the clock signal received from the high voltage portion by a fault detection circuit of the low voltage portion; and
based on the monitoring of the clock signal, outputting a fault signal to a controller, wherein the controller is configured to control power supply to the power transistor.

22. The method of claim 21, wherein monitoring the clock signal comprises:
generating a second clock signal;
providing the second clock signal to a first counter and to first and second flip-flops;
providing an output of the first counter to the first flip-flop;
providing an output of the first flip-flop to the second flip-flop and to a non-inverting input of an AND gate;
providing an output of the second flip-flop to an inverting input of the AND gate; and
providing the clock signal and an output of the AND gate to a second counter.

23. The method of claim 22, further comprising:
providing the output of the AND gate, an output of the second counter, and a reference voltage to a comparator, the output of the second counter provided to the comparator; and
generating the fault signal using the comparator.

24. The method of claim 22, further comprising:
providing an output of the second counter and a reference voltage to an amplifier, the output of the second counter provided to the amplifier;
providing an output of the amplifier to an analog-to-digital converter (ADC);
providing an output of the ADC and the output of the AND gate to a third flip-flop; and
generating the fault signal using the third flip-flop.

\* \* \* \* \*